310-322 SR

3/13/84 XR 4,437,032

United States Patent [19]

Gelhard

[11] 4,437,032

[45] Mar. 13, 1984

[54] SENSOR FOR DISTANCE MEASUREMENT BY ULTRASOUND

[76] Inventor: Egon Gelhard, Thomas-Mann-Str, 10, D-5000 Köln 51, Fed. Rep. of Germany

[21] Appl. No.: 421,484

[22] Filed: Sep. 22, 1982

[30] Foreign Application Priority Data

Sep. 23, 1981 [DE] Fed. Rep. of Germany ....... 3137745

[51] Int. Cl.[3] ........................................... H01L 41/08

[52] U.S. Cl. ................................... 310/324; 310/322; 310/327

[58] Field of Search ............... 310/326, 327, 334, 336, 310/322, 324; 73/620, 625, 642, 617, 644, 645, 629, 632, DIG. 4

[56] References Cited

U.S. PATENT DOCUMENTS 2,912,856 11/1959 Kritz ................................ 73/632 X
3,846,650 11/1974 Barrow .......................... 310/326 X
3,890,423 6/1975 Zacharias, Jr. ................. 310/336 X
4,041,335 8/1977 Nagata et al. .................. 310/326 X
4,359,659 11/1982 Phillips .......................... 310/326 X

*Primary Examiner*—Mark O. Budd
*Attorney, Agent, or Firm*—Allison C. Collard; Thomas M. Galgano

[57] ABSTRACT

The invention relates to a sensor for performing the distance measuring in accordance with the ultrasound-echo principle, in particular for determining and indicating approaching distances between vehicles and obstacles in close range with an ultrasound transmitter and receiving converter for emitting the ultrasound signals and for receiving the ultrasound signals reflected by the obstacles, whereby the converter consists of an insulated-type transformer with piezo-ceramic resonator disposed thereon, characterized in that dampening material (99) for preventing the energy rich ultrasound emission or reception is provided on the inside of the membrane of the insulator-type transformer on two horizontally opposite disposed circular segments.

6 Claims, 11 Drawing Figures

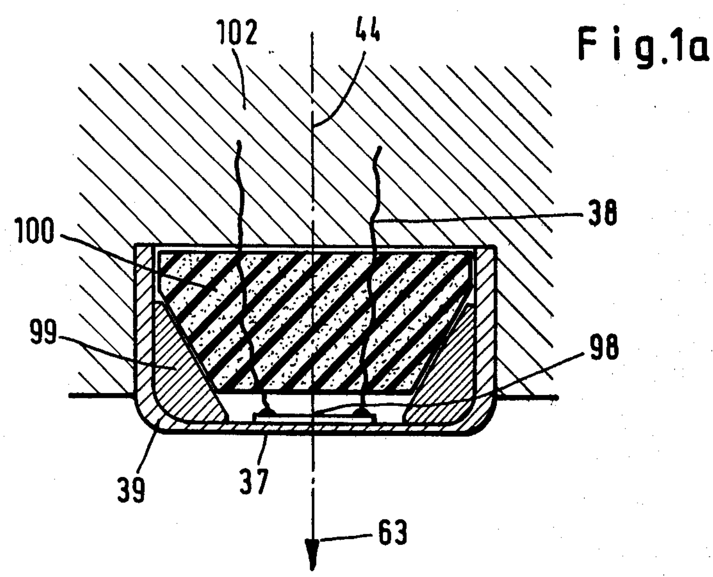
Fig.1a
Fig.1b
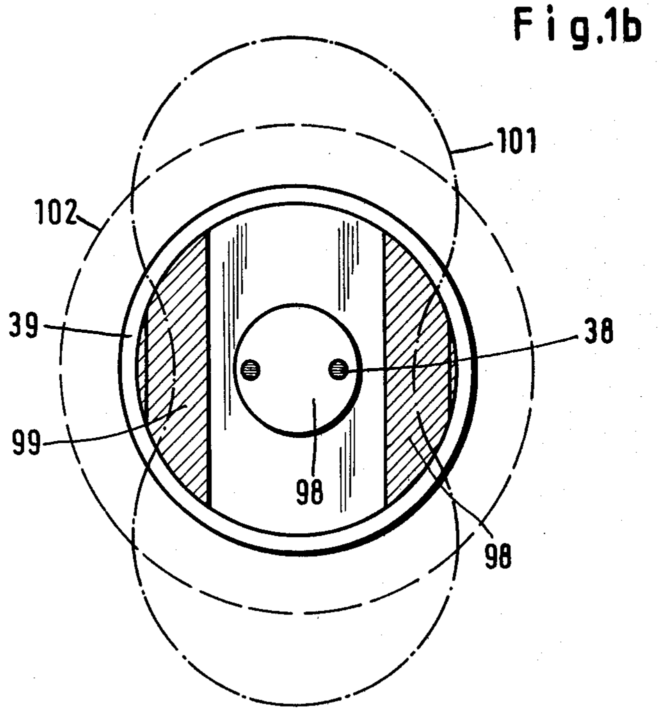

Fig.4a
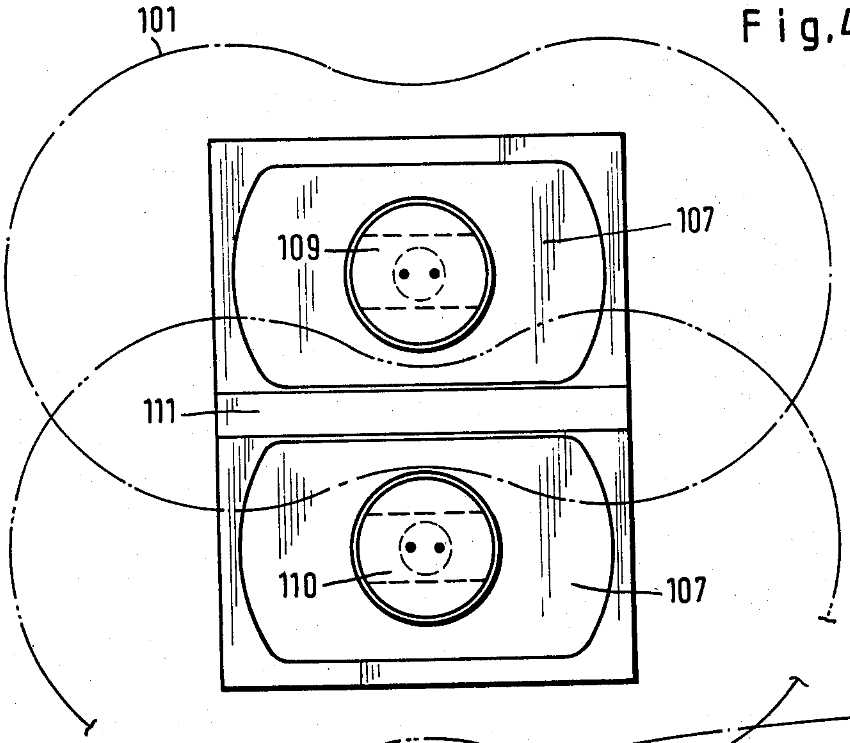
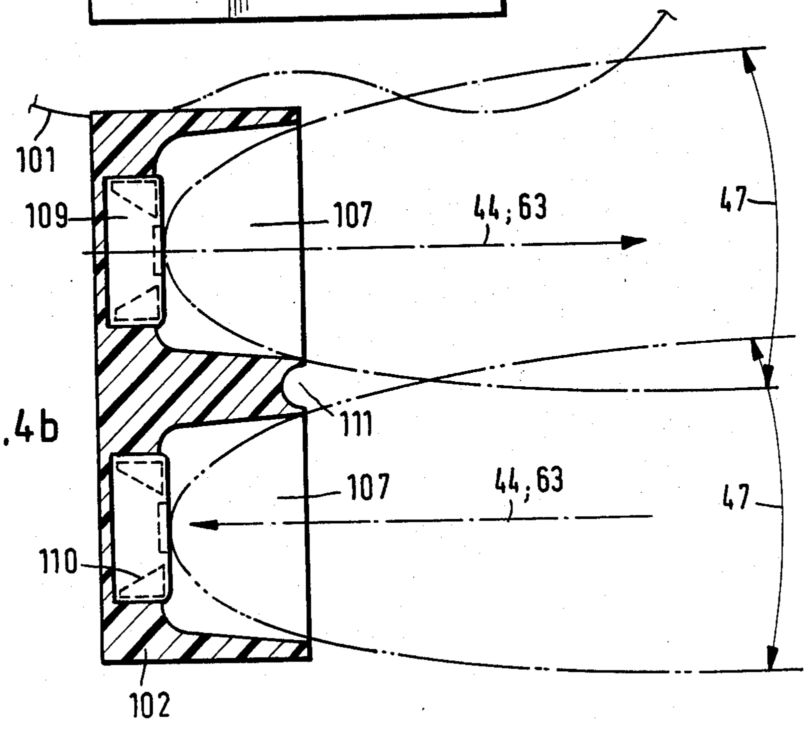
Fig.4b

SENSOR FOR DISTANCE MEASUREMENT BY ULTRASOUND

BACKGROUND OF THE INVENTION

The invention is based on a sensor for performing distance measurement in accordance utilizing the ultrasound-echo principle, in particular for determining and indicating approaching distances between vehicles and obstacles in close range with an ultrasound transmitter and receiving converter for emitting the ultrasound signals and for receiving the ultrasound signals reflected by the obstacles; the converter consists of an insulated-type transformer with piezo-ceramic resonators disposed thereon.

A method for the distance measurements in accordance with the ultrasound-echo principle is described in German patent application No. 30 36 081.7, which can be used in particular for determining and indicating the approaching distances between vehicle and obstacle in the close range.

Following the practical application and the repeated use of the method described in the mentioned patent, it has been shown that the sensitivity, the measuring accuracy, the resistance to interference and the transmission of information to the driver can be improved and the structural size of the sensors used can be considerably reduced.

It is therefore an object of the invention as brought out in the claims to substantially improve the aforementioned sensitivity, measuring accuracy and resistance to interference by using a particularly shaped ultrasound sensor in cup shape with a tightly shaped transmitting and/or receiving beam.

By the inventive measures the following substantial advantages are obtained for determining and indicating the approaching distances between a vehicle and an obstacle in close range.

1. Parking by reverse movement or starting on a loading ramp can frequently be accomplished only by the acoustical signal emission.
2. The installation or the mounting of the sensors with dimensions of about 70 ×45 ×25 mm can be performed at protected locations of the vehicle.

The influencing of the ultrasound-receiver due to any interfering body sound is substantially eliminated.

4. The sensitivity of the system can be increased, since the transmitting and receiving beams can be shaped with tighter and sharper contours, so that ground reflections are eliminated.

BRIEF DESCRIPTION OF THE DRAWING

The attainment of the object of the invention will be described in the following in conjunction with FIGS. 1*a* to 4*b* wherein:

FIG. 1*a* a schematic diagram, to scale, illustrating a cross section through an ultrasound sensor with inner dampening segments.

FIG. 1*b* shows a schematic view from the rear into an opened ultrasound sensor with inner dampening segments in accordance with FIG. 1*a*.

FIG. 4*a* is a schematic front view of a two-transformer system.

FIG. 4*b* is a vertical cross section through a two-transformer system, in accordance with FIG. 4*a*.

DESCRIPTION OF THE PREFERRED EMBODIMENTS

Figure 2A:
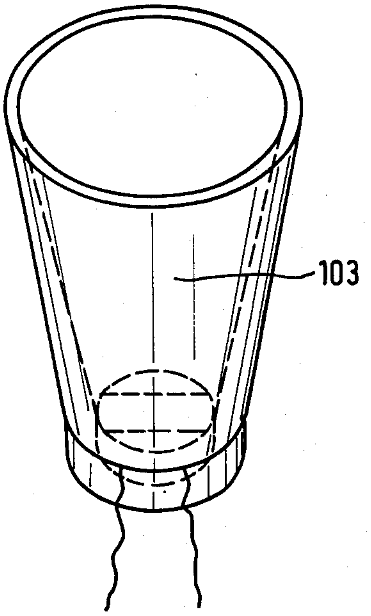
FIG. 2*a* shows a different embodiment of the funnel in the form of a circular cone funnel.
Figure 2C:
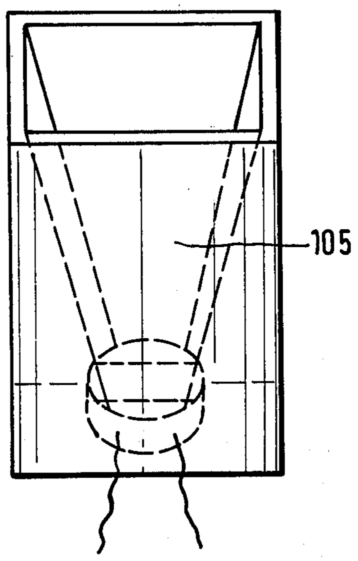
FIG. 2*c* shows yet another embodiment of the funnel in the form of a rectangular-cone-funnel.
Figure 2B:
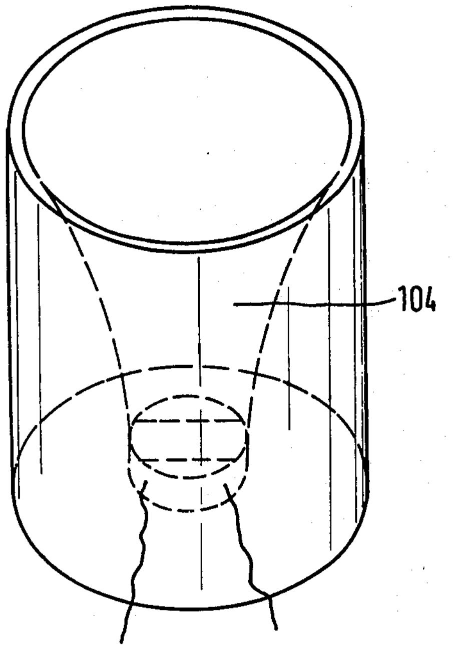
FIG. 2*b* shows still another embodiment of the funnel in the form of a parabolic-cone-funnel.
Figure 2D:
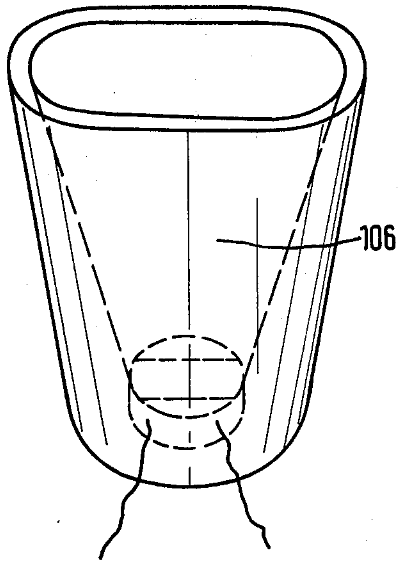
FIG. 2*d* shows a further different embodiment of the funnel in the form of a funnel with an oval cone cross section.

As can be seen from FIGS. 1*a* and 1*b*, a piezo ceramic resonator is bonded to the inside of a cup like converter housing 39 which is formed with a relatively thick walled housing jacket and of a thin walled transmitter and receiver membrane 37 which is formed as a thin walled housing bottom, so that electrical energy is fed to the resonator by means of an electrical line 38. The membrane thickness, inherent resonance and the exciting frequency are tuned with respect to each other. The frequency range is between 28 and 86 kHz. It has been shown to be advantageous to provide an operating frequency between 29 and 30 kHz for a converter housing diameter of about 25 mm.

On the inside, two horizontally oppositely disposed circular segment like dampening segments made of soft rubber are mounted (by casting or vulcanisation) onto the converter housing 39, so that these segments cover about 20 to 40% of the inner membrane face and also have an intimate contact with the inner housing wall.

When the converter is used as a transmitter, a Shore-hardness of 50 to 60 degrees is suitable, if it is used as a receiver then a 40 degree Shore hardness should not be exceeded.

When using as a transmitter and receiver (single-converter-system) a compromise at about 45 degree Shore should be sought.

The mounted dampening segments have the effect that the curved path 101 shown in FIG. 1*b* is obtained in a median measuring distance, without generating the very interfering beam tips and a 45 degree position which occur with undampened converters in actual use.

Up to now, a theoretical explanation for this effect could not be found, because it is assumed that this effect which can be reproduced with great reliability occurs only when the converter diameter, converter wall and membrane thickness, volume, hardness and contact face of the dampening material, inherent and exciting frequency of the piezo ceramic resonator are tightly tuned with respect to each other.

So that any possible body sound (motor vibration) can be kept away from the converter housing 39 and from the resonator 98, the actual housing for the sensor is made from soft plastic or soft rubber of about 80 degree Shore-hardness.

Thereby, it is simultaneously prevented that deformation forces, caused by inexpert assembly, can be effective on the converter in an interfering manner.

It should be noted that for reasons of clarity, the horizontal axis on FIG. 1*b* is shown in a vertical position.

In FIGS. 2*a* to 2*d*, the converter shown in FIG. 1 can be mounted on housings with funnels of the most different shapes and cross sections, so that depending on the funnel shape and funnel length, the form of the transmitting beam and/or receiver beam obtained by the dampening segments can still be varied.

The illustrated cross-sections (circular, rectangular or oval) can be assembled into funnels with two-plane-curves (for example of parapolic shape).

Figure 3A:
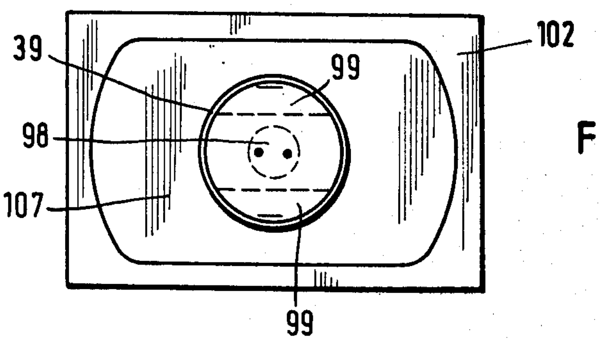
FIG. 3*a* shows the view of a sensor for a single transformer system.
Figure 3B:
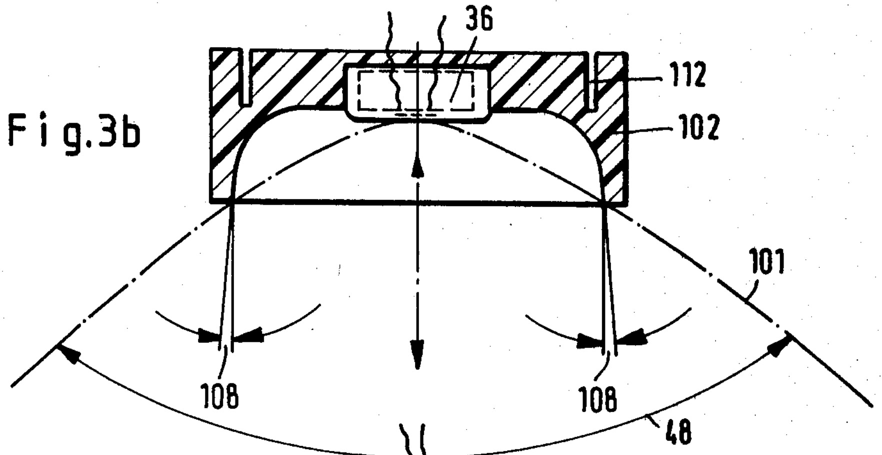
FIG. 3*b* is a schematic diagram, not to scale of a, horizontal cross section through a sensor, in accordance with FIG. 3*a*.
Figure 3C:
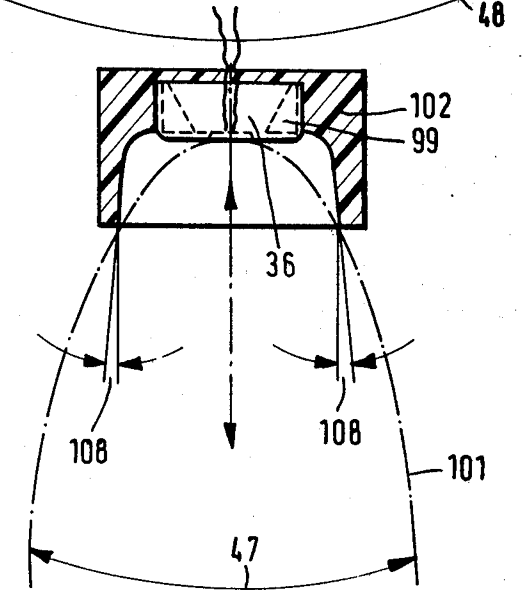
FIG. 3*c* is a schematic diagram, not to scale of a, vertical cross section through a sensor, in accordance with FIG. 3*a*.

In a substantial test series it was determined in FIGS. 3*a*, and 3*b* that a converter 30 which is disposed in a recess 107 of a rectangular like housing 102, provides an optimal additional shaping of the expansion beam when used operationally if the recess, measured on the discharge face, has about 2 to 2.5 times the converter diameter width, 1.5 times the converter diameter height and 0.7 to 0.8 times the converter diameter depth, so that, the recess edge angle 108, measured with respect to the system axis 44, has a minimum of about 5° degree.

Such an embodiment enables the transmitter and receiver beams 101 to have a large effective horizontal angle 48 and a small effective vertical angle without there occuring any interfering side peaks.

Slots 112 or bores may be provided in housing 103 for a tension-free assembly.

When one operates with a two-converter-system, two converter housings in accordance with FIGS. 3*a* and 3*b* can be united into one block, so that the upper recess receives the ultrasound transmitter and the lower recess receives the ultrasound receiver (FIGS. 4*a* and 4*b*). However, in order to avoid a direct coupling between the transmitter and the receiver, a transversely extending partition formed with a groove 111 with a semi-circularly shaped cross section between the two recesses in the front face of the housing has been shown to be effective. This has been determined in numerous tests. A theoretical explanation could also not be found up to now, caused by numerous extraneous conditions.

I claim:

1. In a sensor for measuring distance by transmitting ultrasound signals beamed onto objects, and receiving signals reflected from said objects, including an ultrasound transmitter member for transmitting said signals, and an ultrasound receiver member for receiving the reflected signals, at least one of said members including a converter formed with a cavity and having piezoceramic resonator means disposed therein for converting the ultrasound signals to electrical signals, or the electrical signals to the ultrasound signals, said converter including a substantially circular membrane having an inner side, the improvement comprising, in combination, damping means disposed on opposite circular segments of the inner side of said substantially circular membrane for preventing the transmission or reception of ultrasound signals having excessive strength.

2. The sensor as claimed in claim 1, wherein said one of said members is said ultrasound transmitter member, and wherein said damping means includes soft rubber having a Shore hardness of about 50° to 60°

3. The sensor as claimed in claim 1, wherein said one of said members is said ultrasonic receiver member, and wherein said damping means includes soft rubber having a Shore hardness of at most 40°.

4. The sensor as claimed in claim 1, further comprising a housing defining two compartments separated by a partition facing frontwards, and accommodating said transmitter member and said receiver member, respectively, so as to accoustically decouple said members from one another.

5. In a sensor for measuring distance by transmitting ultrasound signals beamed onto objects, and receiving signals reflected from said objects, including an ultrasound transmitter member for transmitting said signals, and an ultrasound receiver member for receiving the reflected signals, at least one of said members including a converter formed with a cavity and having piezoceramic resonator means disposed therein for converting the ultrasound signals to electrical signals, or the electrical signals to the ultrasound signals, said converter including a membrane having an inner side, the improvement comprising, in combination.

damping material disposed on opposite end portions of the inner side of said membrane for preventing the transmission or reception of ultrasound signals having excessive strength, and a housing for receiving at least one of said members, said housing having a Shore hardness of about 80°.

6. The sensor as claimed in claim 5, wherein said housing is formed with a rim defining in part said cavity and accommodating at least one of said members, said signals being transmitted or received within a predefined beam having a central axis normally coinciding with a center axis of said housing, said one of said members being disposed in said cavity so that said beam is operatively limited to an angle of plus/minus 85° with respect to said central axis by said rim.

* * * * *